United States Patent
Kim et al.

(10) Patent No.: US 7,611,956 B2
(45) Date of Patent: Nov. 3, 2009

(54) SEMICONDUCTOR DEVICE HAVING MOS VARACTOR AND METHODS FOR FABRICATING THE SAME

(75) Inventors: Dae-Hyun Kim, Suwon-si (KR); Han-Su Oh, Suwon-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 161 days.

(21) Appl. No.: 11/941,192

(22) Filed: Nov. 16, 2007

(65) Prior Publication Data
US 2008/0081426 A1     Apr. 3, 2008

Related U.S. Application Data

(62) Division of application No. 11/048,715, filed on Feb. 3, 2005, now Pat. No. 7,307,335.

(30) Foreign Application Priority Data
Feb. 12, 2004   (KR) .................... 2004-9380

(51) Int. Cl.
*H01L 21/20*    (2006.01)
*H01L 21/8234*  (2006.01)
*H01L 21/8244*  (2006.01)

(52) U.S. Cl. ............ 438/379; 438/238; 257/E21.351; 257/E21.378

(58) Field of Classification Search ......... 438/238, 438/239.24, 241, 379; 257/E21.351, E21.378
See application file for complete search history.

(56) References Cited

U.S. PATENT DOCUMENTS

| | | | |
|---|---|---|---|
| 3,590,340 | A | 6/1971 | Kubo et al. |
| 4,285,001 | A | 8/1981 | Gerzberg et al. |
| 5,038,184 | A | 8/1991 | Chiang et al. |
| 5,210,438 | A | 5/1993 | Nakamura |
| 5,489,547 | A | 2/1996 | Erdeljac et al. |
| 6,172,378 | B1 | 1/2001 | Hull et al. |
| 6,191,018 | B1 | 2/2001 | Yue et al. |
| 6,246,084 | B1 | 6/2001 | Kim |
| 6,518,642 | B2 | 2/2003 | Kim et al. |
| 6,603,172 | B1 | 8/2003 | Segawa et al. |
| 2003/0047782 | A1 | 3/2003 | Hasegawa et al. |
| 2003/0127691 | A1 | 7/2003 | Yue et al. |
| 2003/0183880 | A1 | 10/2003 | Goto et al. |
| 2005/0168319 | A1 | 8/2005 | Bhattacharya et al. |

FOREIGN PATENT DOCUMENTS

| | | |
|---|---|---|
| KR | 1020010054440 A | 7/2001 |
| KR | 1020010086499 A | 9/2001 |

*Primary Examiner*—Walter L Lindsay, Jr.
(74) *Attorney, Agent, or Firm*—Volentine & Whitt, PLLC

(57) ABSTRACT

A semiconductor device with having a MOS varactor and methods of fabricating the same are disclosed. The MOS varactor includes a metal gate electrode, an active semiconductor plate interposed between the metal gate electrode and the semiconductor substrate, and a capacitor dielectric layer interposed between the metal gate electrode and the active semiconductor plate. Further, a lower insulating layer insulates the MOS varactor from the semiconductor substrate. According to the present invention, a metal gate electrode is used to reduce poly depletion, thereby increasing a tuning range of the varactor, and to manufacture a reliable metal resistor without the need of an additional photomask.

16 Claims, 7 Drawing Sheets

SEMICONDUCTOR DEVICE HAVING MOS VARACTOR AND METHODS FOR FABRICATING THE SAME

CROSS-REFERENCE TO RELATED APPLICATIONS

This is a divisional of application Ser. No. 11/048,715, filed Feb. 3, 2005, which is incorporated herein by reference in its entirety.

BACKGROUND OF THE INVENTION

1. Field of the Invention

The present invention generally relates to semiconductor devices and methods for fabricating the same. More particularly, the present invention generally relates to semiconductor devices having a metal-oxide semiconductor (MOS) varactor and methods for fabricating the same.

A claim for priority is made to Korean Patent Application No. 2004-9380, filed Feb. 12, 2004, the contents of which are hereby incorporated by reference in their entirety.

2. Description of the Related Art

A varactor is a voltage-variable capacitor used in analog integrated circuit such as a voltage controlled oscillator (VCO) which is one of the most important circuit blocks for radio frequency (RF) front-end. The varactor requires a wide tuning range and a high Q value.

The varactor integrated in a semiconductor device is generally a junction varactor or a MOS varactor. The tuning range in a junction varactor is usually narrower than that of a MOS varactor and does not improve preferably as a CMOS device scales down. Hence, as semiconductor devices become highly integrated, the MOS varactor is more likely becoming a choice in a high frequency integrated circuit.

U.S. Pat. No. 5,038,184 discloses a conventional method of fabricating a MOS varactor.

Generally, the MOS varactor includes an active semiconductor layer and a gate electrode. A capacitor dielectric layer is interposed between the active semiconductor layer and the gate electrode. Therefore, when voltage is applied to the gate electrode, electrical charge accumulates on or depletes from the active semiconductor layer, and accordingly varies the capacitance of the varactor. In case of an accumulation mode MOS varactor, as electrical charge accumulates in the active semiconductor layer, the varactor reaches a maximum capacitance "Cmax". As electrical charge is fully depleted from the active semiconductor layer, the varactor reaches a minimum capacitance "Cmin". The ratio of "Cmax" to "Cmin" determines the tuning range.

The conventional varactor generally employs poly silicon as a gate electrode. Therefore, as electrical charge accumulates in the active semiconductor layer, poly depletion occurs in the gate electrode. The poly depletion in the gate electrode lowers the value of "Cmax", which decreases the tuning range of the varactor. To increase the tuning range of the varactor, the poly depletion must be suppressed in the gate electrode.

In addition, semiconductor integrated circuits require various resistors. In particular, a high frequency integrated circuit requires a reliable metal resistor. The metal resistor is fabricated by forming and patterning a metal film. A photomask is required to pattern the metal film. The use of an additional photomask increases the manufacturing cost of the semiconductor device.

SUMMARY OF THE INVENTION

In one embodiment, the invention is directed to a semiconductor device. The semiconductor device includes a semiconductor substrate, a MOS varactor having a metal gate electrode provided on the semiconductor substrate, an active semiconductor plate interposed between the metal gate electrode and the semiconductor substrate, and a capacitor dielectric layer interposed between the metal gate electrode and the active semiconductor plate, a metal resistor disposed on the same plane as the metal gate electrode and being of a same material as the metal gate electrode, and a lower insulating layer insulating the MOS varactor from the semiconductor substrate.

One embodiment of a method for manufacturing a semiconductor device according to the present invention includes forming a lightly doped semiconductor layer on the lower insulating layer, sequentially forming a dielectric layer and a metal layer on the lightly doped semiconductor layer, forming a metal gate electrode, a capacitor dielectric layer, and an active semiconductor plate having extended portions by patterning the metal layer, the dielectric layer, and the lightly doped semiconductor layer within a first region of the lower insulating layer, forming a metal resistor on the same plane as the metal gate electrode by patterning the metal layer within a second region of the lower insulating layer at the same time the metal layer, the dielectric layer, and the lightly doped semiconductor layer within the first region of the lower insulating layer are patterned, and forming highly doped regions within the active semiconductor plate by implanting impurity ions into the active semiconductor plate, using the metal gate electrode as an ion implantation mask.

Another embodiment of a method for manufacturing a semiconductor device according to the present invention includes forming a lower insulating layer on a semiconductor substrate, forming a lightly doped semiconductor layer on the lower insulating layer, forming an active semiconductor plate by patterning the lightly doped semiconductor layer within a first region of the lower insulating layer, sequentially forming a dielectric layer and a metal layer on the semiconductor substrate having the active semiconductor plate, forming a metal gate electrode on the active semiconductor plate by sequentially patterning the dielectric layer and the metal layer within the first region of the lower insulating layer, forming a semiconductor resistor by patterning the lightly doped semiconductor layer within a second region of the lower insulating layer at the same time the lightly doped semiconductor layer within the first region of the lower insulating layer are pattern, forming a metal resistor on the semiconductor resistor by sequentially patterning the metal layer and the dielectric layer within the second region of the lower insulating layer at the same time sequentially patterning the metal layer and the dielectric layer within the first region of the lower insulating layer, and forming highly doped regions within the active semiconductor plate by implanting impurity ions into the active semiconductor plate, using the metal gate electrode as an ion implantation mask.

BRIEF DESCRIPTION OF THE DRAWINGS

Aspects of the invention will be apparent from the description of the embodiments of the invention, and as illustrated in the accompanying drawings. The drawings are not necessar

DETAILED DESCRIPTION OF THE INVENTION

Figure 1:
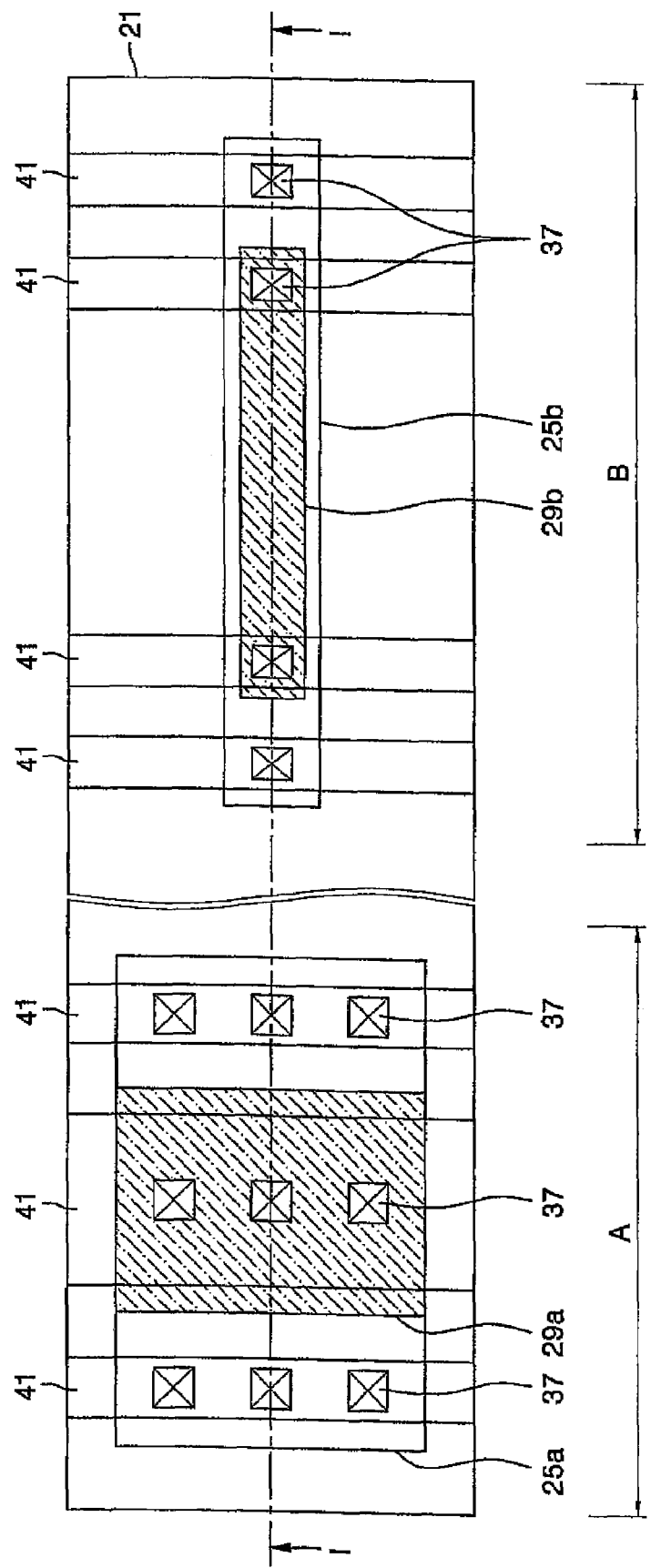
- FIG. 1 is a layout view of a semiconductor device having a MOS varactor according to an embodiment of the present invention.

The present invention will now be described more fully hereinafter with reference to the accompanying drawings, in which exemplary embodiments of the invention are shown. It will be understood that when an element such as a layer, a region or a substrate is referred to as being "on" or "onto" another element, it can be directly on the other element or intervening elements may also be present.

A semiconductor device according to an embodiment of the present invention will be described in detail.

In the drawings, "A" indicates a first region on a semiconductor substrate 21, and "B" indicates a second region on semiconductor substrate 21.

Figure 7:
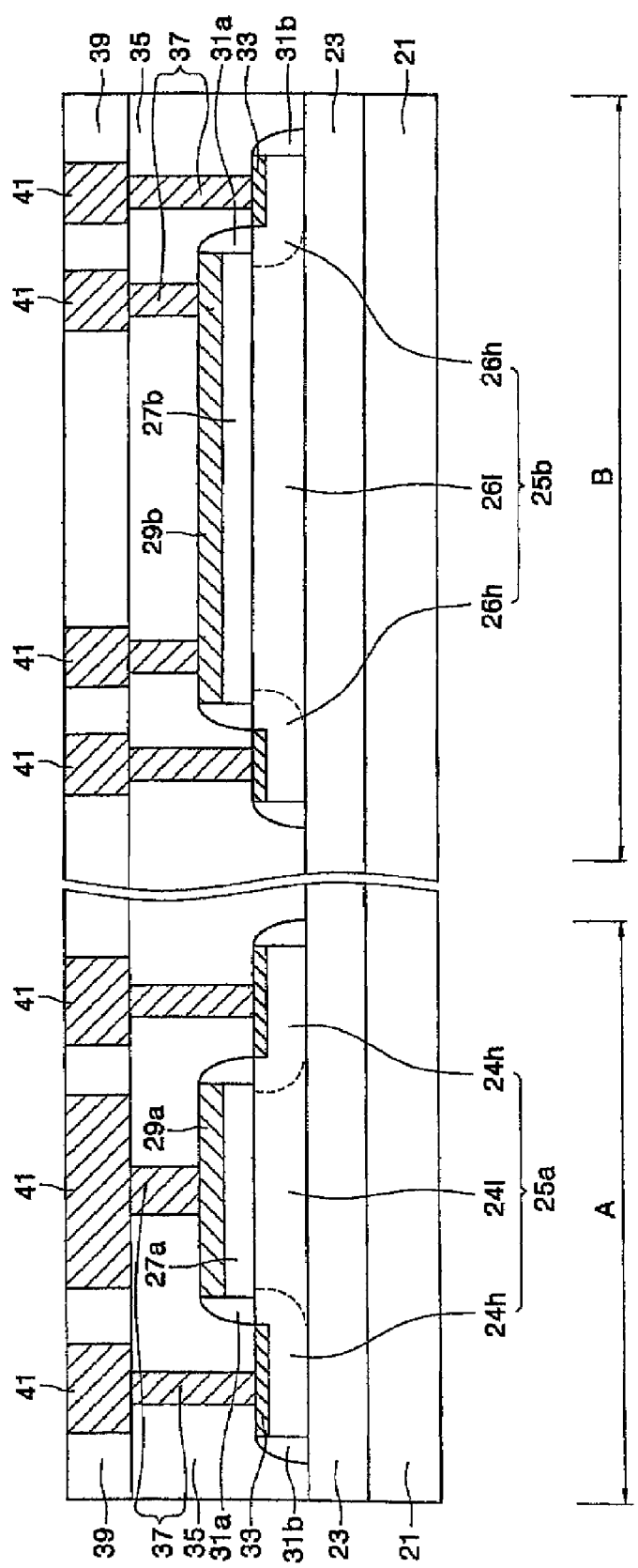

Referring to FIGS. 1 and 7, a MOS varactor is formed in first region "A". The MOS varactor includes a metal gate electrode 29a provided on semiconductor substrate 21, an active semiconductor plate 25a interposed between metal gate electrode 29a and semiconductor substrate 21, and a capacitor dielectric layer 27a interposed between metal gate electrode 29a and active semiconductor plate 25a. Further, a lower insulating layer 23 is interposed between active semiconductor plate 25a and semiconductor substrate 21 to insulate the MOS varactor from semiconductor substrate 21.

Metal gate electrode 29a is a metal layer of titanium (Ti), tantalum nitride (TaN), titanium nitride (TiN), or tungsten (W). Further, metal gate electrode 29a is in contact with capacitor dielectric layer 27a.

Capacitor dielectric layer 27a is formed of silicon dioxide ($SiO_2$), but may also be formed of any other high-k dielectric material such as silicon nitride (SiN). The higher the dielectric constant of capacitor dielectric layer 27a, the wider the tuning range of the MOS varactor. Metal gate electrode 29a and capacitor dielectric layer 27a are aligned with each other.

Active semiconductor plate 25a includes extended portions. Here, "extended portions" means the portions of active semiconductor plate 25a extending away from the alignment of the metal gate electrode 27a and capacitor dielectric layer 27a. In other words, the length of the active semiconductor plate is longer than the capacitor dielectric layer 27a and metal gate electrode 29a. Therefore, high concentrations of impurities are implanted in the extended portions to form a ground electrode. In addition, active semiconductor plate 25a includes lightly doped region 24l and highly doped regions 24h. Highly doped regions 24h is preferably used as the ground electrodes for active semiconductor plate 25a.

Lower insulating layer 23 is provided on semiconductor substrate 21. That is, lower insulating layer 23 is formed by depositing an insulating layer on semiconductor substrate 21. An oxidation process or a shallow trench isolation (STI) process may be used in the formation of the insulating layer. Lower insulating layer 23 formed by the oxidation or the STI process is generally referred to as a field oxide layer. Preferably, lower insulating layer 23 is a field oxide layer formed by the STI process.

A metal resistor 29b is provided on second region "B" of semiconductor substrate 21. Metal resistor 29b is provided on the same plane as metal gate electrode 29a. Further, metal resistor 29b is made of the same material as metal gate electrode 29a.

A semiconductor resistor 25b is interposed between metal resistor 29b and semiconductor substrate 21. Semiconductor resistor 25b is provided on the same plane as active semiconductor plate 25a. Semiconductor resistor 25b also includes extended portions, which extend beyond metal resistor 29b. Semiconductor resistor 25b also includes lightly doped region 26l and highly doped regions 26h. Highly doped regions 26h are preferably used as electrodes for semiconductor resistor 25b.

A patterned dielectric layer 27b is interposed between metal resistor 29b and semiconductor resistor 25b. Patterned dielectric layer 27b is made of the same material as capacitor dielectric layer 27a.

First spacers 31a cover sidewalls of metal gate electrode 29a and capacitor dielectric layer 27a. First spacers 31a also cover sidewalls of metal resistor 29b and patterned dielectric layer 27b. Further, second spacers 31b cover sidewalls of active semiconductor plate 25a and semiconductor resistor 25b.

Self-aligned silicide layers (or salicide layers) 33 are provided on the extension portions of active semiconductor plate 25a and semiconductor resistor 25b. Metal interconnection lines 41 are disposed above metal gate electrode 29a and extension portions of active semiconductor plate 25a. Metal interconnection lines 41 are disposed across both sides of metal resistor 29b and semiconductor resistor 25b. Here, metal interconnection lines 41 are electrically connected to salicide layers 33, metal gate electrode 29a, and metal resistor 29b through a plurality of via holes 37. To increase the Q value of a MOS varactor, the plurality of via holes 37 are preferably used to electrically connect metal gate electrode 29a with metal interconnection line 41.

Spaces between metal interconnection line 41 and the plurality of via holes 37 are filled with an interlayer insulating layer 35 and an upper insulating layer 39.

Accordingly, a metal gate electrode is used to form the varactor, which prevents poly depletion. Further, the metal resistor is formed at the same time the metal gate electrode is formed, which integrates a reliable metal resistor in a semiconductor device without the need of an additional photomask.

A method of fabricating a semiconductor device according to an embodiment of the present invention will now be described.

Figure 2:
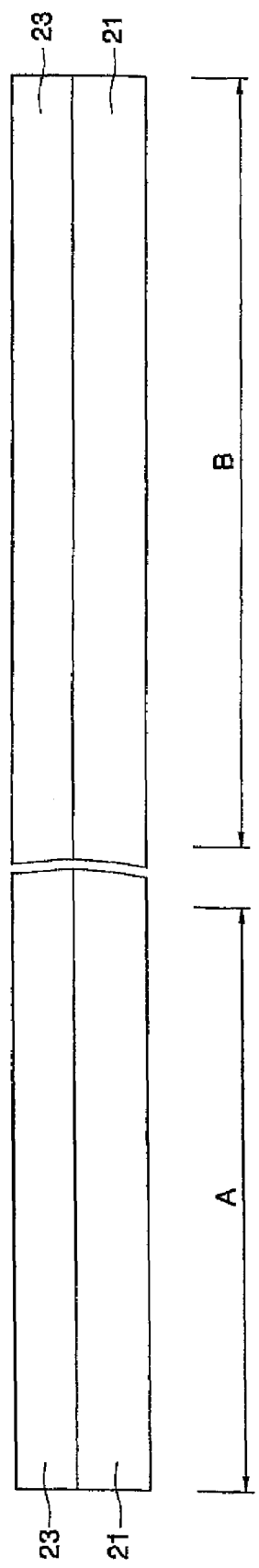
FIGS. 2 through 7 are cross-sectional views taken along line I-I of FIG. 1 to illustrate a method of fabricating a semiconductor device according to the embodiment of the present invention.

Referring to FIGS. 1 and 2, a lower insulating layer 23 is formed on a semiconductor substrate 21. Lower insulating layer 23 is formed by depositing an insulating material on semiconductor substrate 21. Alternatively, lower insulating layer 23 is formed by a STI process. That is, semiconductor substrate 21 is patterned to form a trench. An insulating layer fills the trench, and the insulating layer is planarized to form lower insulating layer 23.

Figure 3:
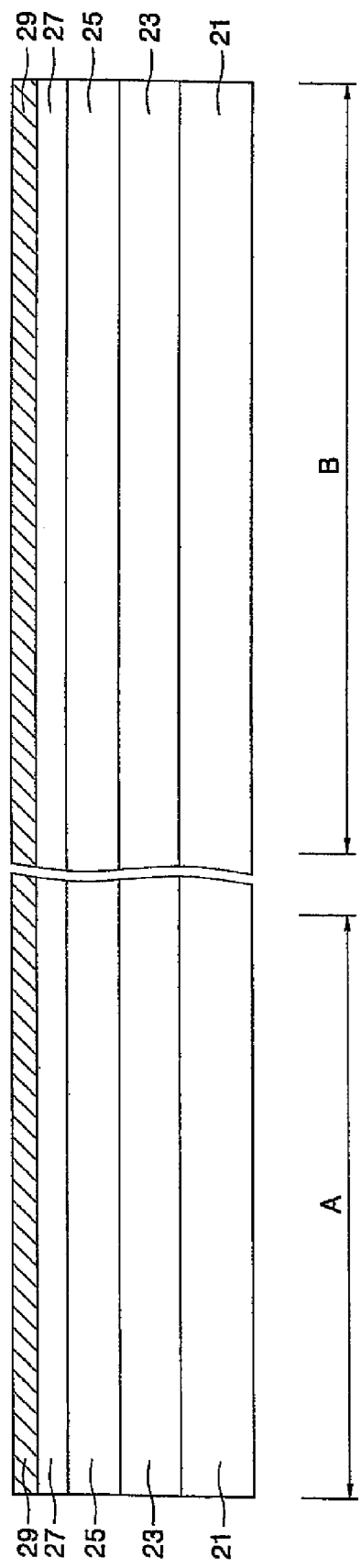

Referring to FIGS. 1 and 3, lightly doped layer 25 is formed on lower insulating layer 23. Lightly doped layer 25 is preferably lightly doped silicon layer. For example, a silicon layer is formed on lower insulating layer 23, and then low concentration of impurities is implanted into the silicon layer by an ion implantation process to form a lightly doped silicon layer. Preferably, the silicon layer is a poly silicon layer.

A dielectric layer 27 and a metal layer 29 are sequentially formed on lightly doped layer 25. Dielectric layer 27 is formed of silicon dioxide ($SiO_2$), or may be formed of any other high-k dielectric material such as silicon nitride (SiN). Dielectric layer 27 is preferably formed of a stacked layer of silicon dioxide and silicon nitride.

Metal layer 29 is formed of metal nitride such as a tantalum nitride (TaN) or a titanium nitride (TiN), or a metal having a high melting point such as tungsten (W). Metal layer 29 is preferably formed of a stacked layer of Ti and TiN.

Figure 4:
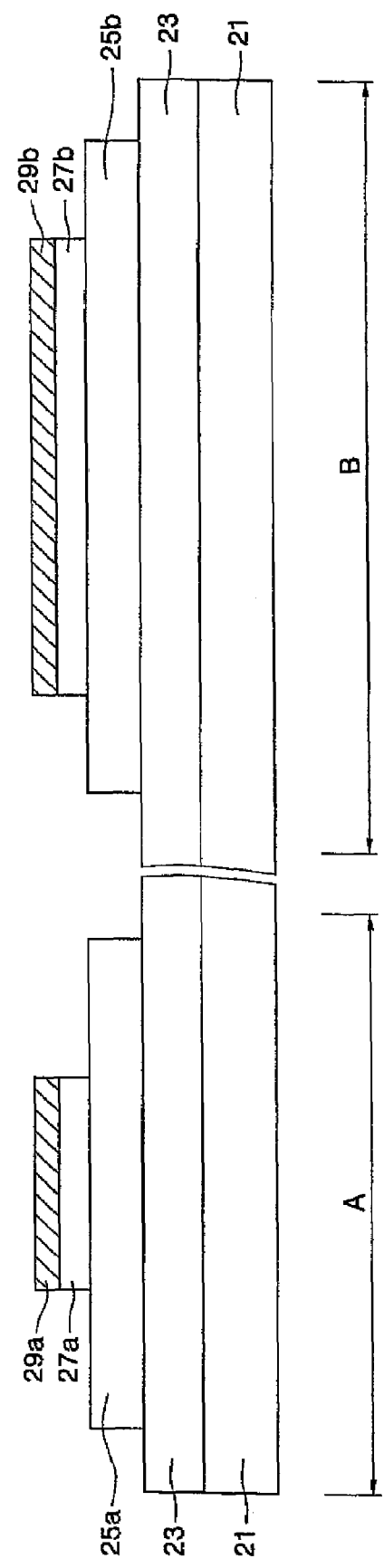

Referring to FIGS. 1 and 4, metal layer 29, dielectric layer 27, and lightly doped layer 25 are patterned within first region "A" to form a metal gate electrode 29a, a capacitor dielectric layer 27a, and an active semiconductor plate 25a having extended portions.

In detail, metal layer 29, dielectric layer 27, and lightly doped layer 25 are patterned as follows.

Metal layer 29 and dielectric layer 27 within first region "A" are sequentially patterned using a photolithography process and an etching process to form metal gate electrode 29a and capacitor dielectric layer 27a. At the same time, metal layer 29 within second region "B" is patterned to form a metal resistor 29b and a patterned dielectric layer 27b. Thereafter, lightly doped layer 25 is patterned by a photolithography process and an etching process to form an active semiconductor plate 25a and a semiconductor resistor 25b.

Alternatively, metal layer 29, dielectric layer 27, and lightly doped semiconductor layer 25 are continuously patterned using sequential photolithography and etching processes to form active semiconductor plate 25a. In one embodiment, metal layer 29 and dielectric layer 27 in second region "B" are simultaneously formed and patterned. That is, patterned metal layer 29 and patterned dielectric layer 27 may be patterned using sequential photolithography and etching processes to form metal gate electrode 29a and capacitor dielectric layer 27a. Further, metal layer 29, dielectric layer 27, and lightly doped semiconductor layer 25 within second region "B" are patterned in the same manner. On the other hand, if semiconductor resistor 25b is not required, the process of continuously patterning metal layer 29, dielectric layer 27, and lightly doped semiconductor layer 25 within second region "B" may be omitted.

Active semiconductor plate 25a and semiconductor resistor 25b may be formed prior to the formation of dielectric layer 27. That is, after forming lightly doped semiconductor layer 25, lightly doped semiconductor layer 25 is patterned by a photolithography process and an etching process to form active semiconductor plate 25a and semiconductor resistor 25b. Then, dielectric layer 27 and metal layer 29 are sequentially formed. Then, metal layer 29 and dielectric layer 27 are sequentially patterned to form metal gate electrode 29a and capacitor dielectric layer 27a. At the same time, metal resistor 29b and patterned dielectric layer 27b may be formed.

Figure 5:
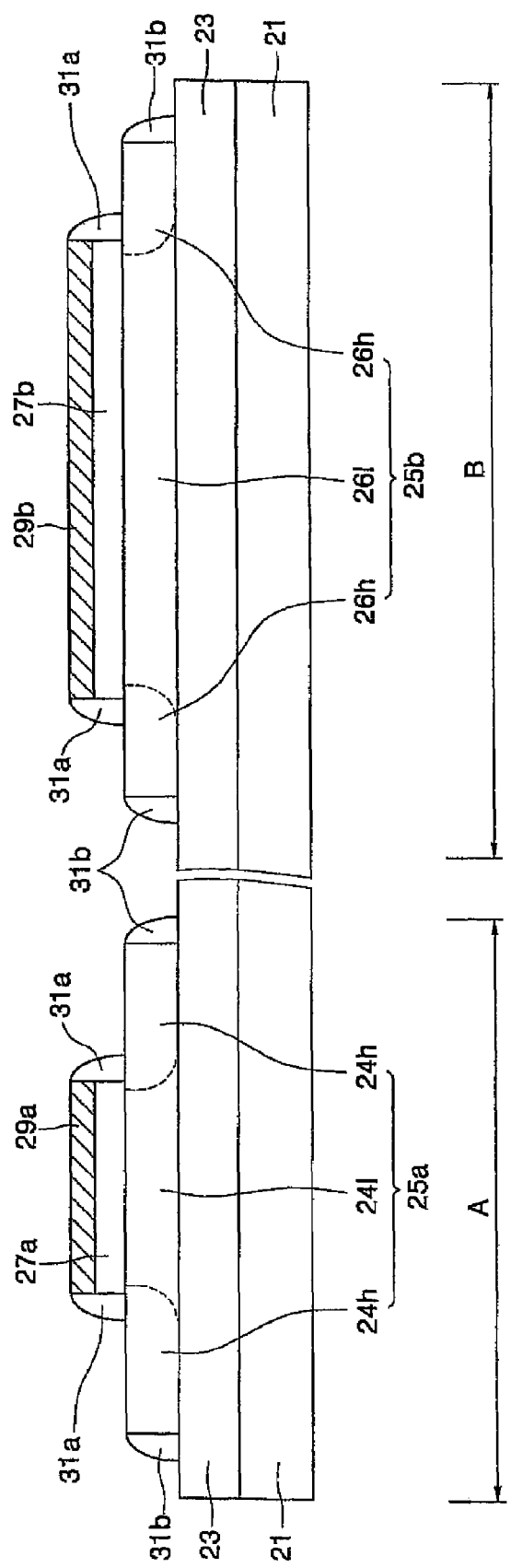

Referring to FIGS. 1 and 5, a spacer insulating layer (not shown) is formed on metal gate electrode 29a, active semiconductor plate 25a, metal resistor 29b, and patterned dielectric layer 27b. The spacer insulating layer may be of silicon nitride, or a stacked layer of silicon oxide and silicon nitride. The spacer insulating layer is etched to form first spacers 31a covering sidewalls of metal gate electrode 29a and capacitor dielectric layer 27a. Also, while first spacers 31a are formed, second spacers 31b are formed to cover sidewalls of active semiconductor plate 25a and semiconductor resistor 25b.

Impurity ions are implanted into active semiconductor plate 25a and semiconductor resistor 25b, using spacers 31a, metal gate electrode 29a, and metal resistor 29b as an ion implantation mask to form highly doped regions 24h, 26h. As highly doped regions 24h, 26h are formed, lightly doped regions 24l, 26l are formed under metal gate electrode 29a and metal resistor 29b, respectively. Highly doped regions 24h formed within active semiconductor plate 25a are preferably used as a ground electrode.

Highly doped regions 24h, 26h are preferably doped with the same type of impurities as those of lightly doped regions 24l, 26l. That is, in the case where lightly doped regions 24l, 26l are doped with N-type impurities, highly doped regions 24h, 26h are also doped with N-type impurities. Oppositely, in the case where lightly doped regions 24l, 26l are doped with P-type impurities, highly doped regions 24h, 26h are also doped with P-type impurities.

Figure 6:
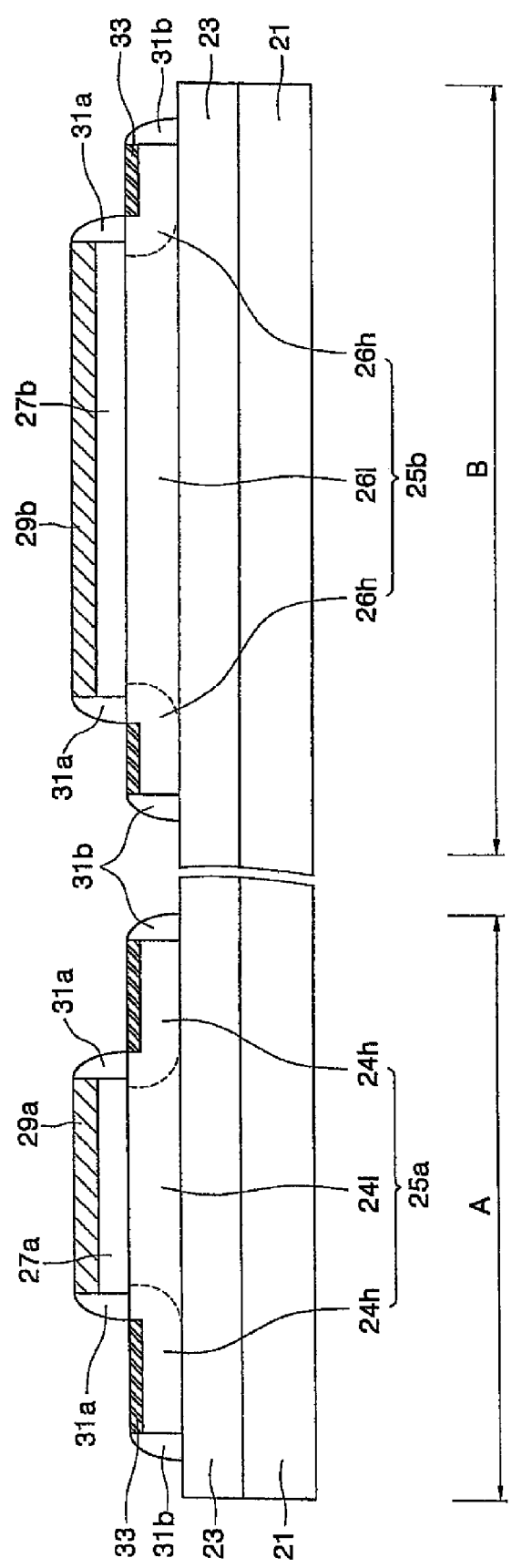

Referring to FIGS. 1 and 6, a metal layer of nickel (Ni), cobalt (Co), or titanium (Ti) is formed on highly doped regions 24h, 26h. Then, the metal layer is subjected to heat treatment to form salicide layers 33. Salicide layers 33 are self-aligned on highly doped regions 24h, 26h. After forming salicide layers 33, any remaining residual metal layer is removed.

Referring to FIGS. 1 and 7, an interlayer insulating layer 35 is formed on salicide layers 33. Interlayer insulating layer 35 is preferably silicon dioxide ($SiO_2$) or some other low-k dielectric material.

Interlayer insulating layer 35 is patterned to form a plurality of via holes 37 to expose salicide layers 33, metal gate electrode 29a, and metal resistor 29b. Then, a metal layer fills the plurality of via holes 37. Then, the metal layer is planarized to expose the top surface of interlayer insulating layer. Here, metal layer is planarized by a blanket etching or a chemical mechanical planarization (CMP) process.

An upper metal layer is formed on the plurality via holes 37, and patterned to form metal interconnection lines 41 over via holes 37. Metal interconnection line 41 electrically connected to metal gate electrode 29a is used as a signal line. In addition, an upper insulating layer 39 is formed on semiconductor substrate having metal interconnection lines 41 and then planarized to fill spaces between metal interconnection lines 41.

Here, metal interconnection lines 41 are preferably formed by a damascene process. That is, upper insulating layer 39 is formed on semiconductor substrate having the plurality of via holes 37. Then, upper insulating layer 39 is patterned to form grooves above the plurality of via holes 37. Thereafter, grooves are filled with an upper conductive layer, and then the upper conductive layer is planarized to form metal interconnection lines 41 in the grooves.

Further, the plurality of via holes 37 and metal interconnection lines 41 are also preferably formed by a dual-damascene process. That is, upper insulating layer 39 is formed on interlayer insulating layer 35. Then, interlayer insulating layer 35 and upper insulating layer 39 are patterned to form via holes through which salicide layers 33, gate electrode 29a, and metal resistor 29b are exposed to form the grooves crossing above the via holes. Thereafter, the via holes and the grooves are filled with an upper metal layer, and then the upper metal layer is planarized to form via holes 37 and metal interconnection lines 41.

Exemplary embodiments of the present invention have been disclosed herein and, although specific terms are employed, they are used and are to be interpreted in a generic and descriptive sense only and not for purpose of limitation. Accordingly, it will be understood by those of ordinary skill in the art that various changes in form and details may be made without departing from the scope of the present invention as set forth in the following claims.

What is claimed is:

1. A method for fabricating a semiconductor device, the method comprising:

forming a lower insulating layer on a semiconductor substrate;

forming a lightly doped semiconductor layer on the lower insulating layer;

sequentially forming a dielectric layer and a metal layer on the lightly doped semiconductor layer;

forming a metal gate electrode, a capacitor dielectric layer, and an active semiconductor plate having extended portions by patterning the metal layer, the dielectric layer, and the lightly doped semiconductor layer within a first region of the lower insulating layer; forming a metal resistor on the same plane as the metal gate electrode by patterning the metal layer within a second region of the lower insulating layer at the same time the metal layer, the dielectric layer, and the lightly doped semiconductor layer within the first region of the lower insulating layer are patterned;

and forming highly doped regions within the active semiconductor plate by implanting impurity ions into the active semiconductor plate, using the metal gate electrode as an ion implantation mask.

2. The method as claimed in claim 1, further comprising forming a semiconductor resistor by patterning the dielectric layer and the lightly doped semiconductor layer within the second region of the lower insulating layer while patterning the metal layer, the dielectric layer, and the lightly doped semiconductor layer within the first region of the lower insulating layer.

3. The method as claimed in claim 2, further comprising forming the highly doped regions within the semiconductor resistor by implanting impurity ions into the semiconductor resistor, using the metal resistor as an ion implantation mask, at the same time the impurity ions are being implanted into the active semiconductor plate, using the metal gate electrode as the ion implantation mask.

4. The method as claimed in claim 1, wherein the metal layer is formed from a metal selected from a group consisting of titanium (Ti), tantalum nitride (TaN), titanium nitride (TiN) layer, and tungsten (W).

5. The method as claimed in claim 3, further comprising forming salicide layers on the highly doped regions of the active semiconductor plate and the semiconductor resistor, respectively.

6. The method as claimed in claim 5, further comprising:

forming an interlayer insulating layer on the salicide layers;

patterning the interlayer insulating layers to form a plurality of via holes to expose the salicide layers, the gate electrode, and the metal resistor;

filling the plurality of via holes; and forming metal interconnection lines on the plurality of via holes.

7. The method as claimed in claim 3, further comprising forming spacers covering sidewalls of the metal gate electrode and the metal resistor before implanting the impurity ions.

8. The method of claimed in claim 6, wherein the metal interconnection lines are formed by a damascene process.

9. The method of claimed in claim 6, wherein the metal interconnection lines and plurality of via holes are formed by a dual-damascene process.

10. A method of fabricating a semiconductor device, the method comprising:

forming a lower insulating layer on a semiconductor substrate; forming a lightly doped semiconductor layer on the lower insulating layer;

forming an active semiconductor plate by patterning the lightly doped semiconductor layer within a first region of the lower insulating layer;

sequentially forming a dielectric layer and a metal layer on the semiconductor substrate having the active semiconductor plate;

forming a metal gate electrode on the active semiconductor plate by sequentially patterning the dielectric layer and the metal layer within the first region of the lower insulating layer;

forming a semiconductor resistor by patterning the lightly doped semiconductor layer within a second region of the lower insulating layer at the same time the lightly doped semiconductor layer within the first region of the lower insulating layer are pattern; forming a metal resistor on the semiconductor resistor by sequentially patterning the metal layer and the dielectric layer within the second region of the lower insulating layer at the same time sequentially patterning the metal layer and the dielectric layer within the first region of the lower insulating layer; and forming highly doped regions within the active semiconductor plate by implanting impurity ions into the active semiconductor plate, using the metal gate electrode as an ion implantation mask.

11. The method as claimed in claim 10, wherein the metal layer is formed of a metal selected from a group consisting of titanium (Ti), tantalum nitride (TaN), titanium nitride (TiN), and tungsten (W).

12. The method as claimed in claim 10, further comprising forming a semiconductor resistor by patterning the dielectric layer and the lightly doped semiconductor layer within the second region of the lower insulating layer while patterning the metal layer, the dielectric layer, and the lightly doped semiconductor layer within the first region of the lower insulating layer.

13. The method as claimed in claim 10, further comprising forming the highly doped regions within the semiconductor resistor by implanting impurity ions into the semiconductor resistor, using the metal resistor as an ion implantation mask, at the same time the impurity ions are being implanted into the active semiconductor plate, using the metal gate electrode as the ion implantation mask.

14. The method as claimed in claim 13, further comprising forming salicide layers on the highly doped regions of the active semiconductor plate and the semiconductor resistor, respectively.

15. The method as claimed in claim 14, further comprising:

forming an interlayer insulating layer on the salicide layers;

patterning the interlayer insulating layers to form a plurality of via holes to expose the salicide layers, the gate electrode, and the metal resistor;

filling the plurality of via holes; and forming metal interconnection lines on the plurality of via holes.

16. The method as claimed in claim 10, further comprising forming spacers covering sidewalls of the metal gate electrode and the metal resistor before implanting the impurity ions.

* * * * *